United States Patent [19]

Solie

[11] 4,330,728

[45] May 18, 1982

[54] SURFACE ACOUSTIC WAVE COUPLING WITH RESPECT TO NON-PIEZOELECTRIC SUBSTRATES

[75] Inventor: Leland P. Solie, Acton, Mass.

[73] Assignee: Sperry Corporation, New York, N.Y.

[21] Appl. No.: 135,409

[22] Filed: Mar. 31, 1980

[51] Int. Cl.[3] ..... H01L 41/08

[52] U.S. Cl. ..... 310/313 B; 310/313 D

[58] Field of Search ..... 333/150, 153, 154, 155; 310/313 R, 313 A, 313 B, 313 C, 313 D

[56] References Cited

U.S. PATENT DOCUMENTS

| | | | |
|---|---|---|---|
| 3,515,911 | 6/1970 | Byram et al. | 310/313 R |
| 3,665,225 | 5/1972 | Heuvel | 310/313 B |
| 3,673,474 | 6/1972 | White et al. | 310/313 R X |
| 3,970,778 | 7/1976 | Adkins | 310/313 B |
| 3,987,378 | 10/1976 | Onodera | 310/313 B |
| 4,058,745 | 11/1977 | Otto | 310/313 B |
| 4,081,769 | 3/1978 | Shreve | 310/313 B |
| 4,209,759 | 6/1980 | Volluet | 310/313 R X |

*Primary Examiner*—Mark O. Budd

*Attorney, Agent, or Firm*—Howard P. Terry

[57] ABSTRACT

A wide band surface wave transducer is provided with means for launching a surface acoustic wave on a non-piezoelectric material by first launching the surface wave at the surface of a piezoelectric material spaced apart from the aligned non-piezoelectric element. A mechanical coupling array provides energy transfer between the two wave propagating surfaces.

7 Claims, 5 Drawing Figures

SURFACE ACOUSTIC WAVE COUPLING WITH RESPECT TO NON-PIEZOELECTRIC SUBSTRATES

BACKGROUND OF THE INVENTION

1. Field of the Invention

The invention relates generally to acoustic surface wave energy processors employing acoustic means for processing electrical input signals and yielding modified electrical output signals and, more particularly, concerns transducer means for launching a surface acoustic wave on a non-piezoelectric slab-like element by first launching the surface wave at the surface of a piezoelectric slab-like element spaced apart from the aligned non-piezoelectric slab-like element. A plurality of discrete bars or rails, each rail contacting both wave propagating surfaces of the piezoelectric and non-piezoelectric elements, forms an array providing mechanical contact and energy transfer between the wave propagating surfaces. The periodicity of the rails of the array is arranged to maximize coupling of energy into the second or non-piezoelectric element. Since the reciprocity theorem correctly applies to the structure, the functions of the output and input terminals may be interchanged.

2. Description of the Prior Art

Prior art acoustic wave coupling devices of the kind for transferring energy between non-piezoelectric and piezoelectric surfaces, as will be discussed, have generally lacked the capability of operation with acceptble efficiency or with outputs sufficiently free of distortion at input frequencies above about 50 MHz. Since advancing techniques arising in the surface wave art demand such capability, it is an object of this invention to provide a suitable coupling scheme.

DESCRIPTION OF THE PREFERRED EMBODIMENTS

It is well known that there are several requirements needing consideration when selecting surface acoustic wave propagating elements for use in devices utilizing them. The two most important factors of the material are its piezoelectric coupling coefficient and the dependence of its delay upon temperature. For wide band applications, a large piezoelectric coupling coefficient is necessary if excessive losses are to be avoided. In general, the device delay should not be a function of temperature; this is always desirable and is often even essential. Other normally secondary considerations involve the surface acoustic wave velocity, the propagation loss factor, the semiconductor properties where acoustoelectric interactions are to be involved, beam steering, et cetera.

The choice of a material for such wave propagating element depends upon selective interrelated compromises weighted according to the application at hand. For example, a known material with a desirably and significantly strong piezoelectric coupling is $LiNbO_3$; but it has a delay strongly varying with temperature. In the opposite sense, quartz is a very weak piezoelectric, but has substantially and desirably a zero temperature versus delay characteristic. Where a semiconductor is needed, GaAs has good semiconductor properties for acoustoelectric interactions, but has even weaker piezoelectric coupling properties than quartz.

Reflecting upon the nature of the problem, it will be observed that strong piezoelectric coupling is normally necessary only to generate or launch surface waves or, reciprocally, to receive them. For simple propagation of the acoustic surface wave, once set up, the high piezoelectric coupling property is not required. Specifically, for devices that provide a long delay or for reflective array devices, a high piezoelectric coefficient is needed only at the launching and receiving transducers. For propagation otherwise between the input and output transducers, the propagating element may even be a less costly non-piezoelectric material such as quartz.

Figure 1:
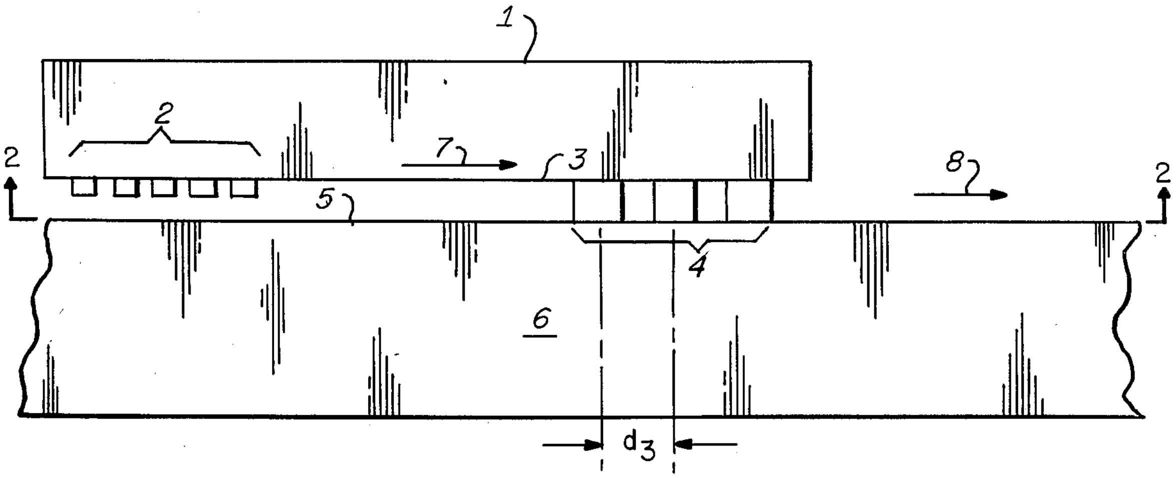
FIG. 1 is a side view of a preferred form of the invention.
Figure 2:
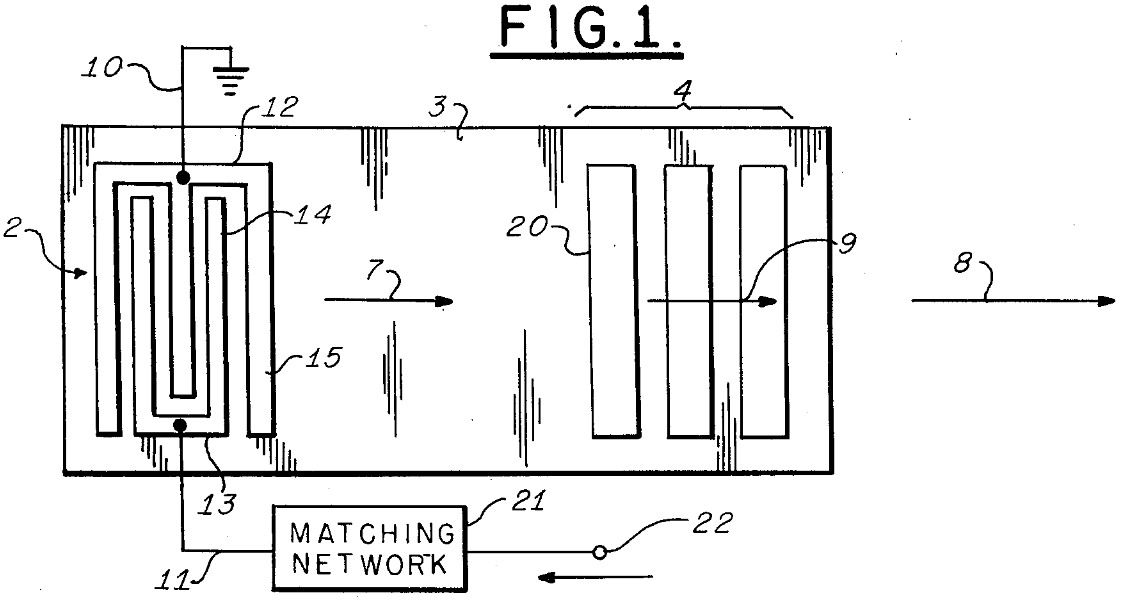
FIG. 2 is a view of part of the apparatus of FIG. 1 looking up along the line 2—2.

In the arrangement of FIGS. 1 and 2, a surface acoustic wave 7 flowing at a surface 3 of a slab-like element 1 of a high piezoelectric coupling material is coupled to the immediately adjacent surface 5 of a second slab-like wave propagating element 6 through an array 4 of spaced direct mechanical contacts such as contact 20. The delay of propagating element 6 desirably has a zero temperature coefficient in many applications; in others, temperature coefficient may be less important, as when a wave is to be launched on a semiconductor substrate.

The high coupling element 1 utilizes on its $LiNbO_3$ signal propagating surface 3 a conventional interdigital launching device 2 for launching the surface acoustic wave 7. Array 2 consists of parallel strips deposited on the surface 3. The array 2 is adapted for coupling the traveling surface acoustic wave 7 to element 1, array 2 being fed with electrical signals via lead 11. Adjacent fingers of electrodes 12, 13, which may be gold, are preferably spaced apart by an integral number of half wave lengths at the operating frequency. The traveling wave at array 2 is successively amplified as it passes under each pair of electrode fingers in the conventional manner. Array 2 may be deposited by evaporation or sputtering or by other well known processes on a surface of a $LiNbO_3$ element or other highly piezoelectric material. The electrode array 2 acts as a conventional interdigital end-fire array, propagating the desired forward flowing acoustic wave in the direction of arrow 7 when driven by electrical signals which may be passed through a conventional matching network 21 and lead 11 from a conventional signal source (not shown) connected at terminal 22. Any opposite flowing acoustic energy may be absorbed in the usual manner.

The surface wave 7 progresses along high piezoelectric coupling element 1 into the novel mechanically contacting array 4 consisting of equally spaced coupling rails 20. Rails 20 may be of deposited gold, aluminum, or the like, metallic or non-metallic, and are generally rectangular including square shaped, long enough to span the width of the beam of acoustic energy generated by launcher 2. They are in intimate contact with the respective propagating surfaces 3, 5 of elements 1, 6. Array 4 sets up the surface wave 8 flowing at the surface propagation element 6, which may be made of quartz or any other desirable material but with relatively weak piezoelectric coupling coefficients. The individual rails 20 of array 4 may be made in the same photolithographic process as the input transducer 2 and may have widths as large as $d_3/2$ or less (FIG. 1). Alternatively, they may be formed at least partly in etched slots in the surface 3 of the high piezoelectric coefficient element 1 or in the surface 5 of propagation element 6, or in both surfaces.

The total number of rails and their widths are determined according to the particular application, configuration, and material combination under consideration. The wave propagating elements 1, 6 may be regarded as supporting two coupled traveling waves where the mechanical coupling through the rail array 4 provides a mechanism for energy exchange. If the acoustic path perpendicular to the rails is proper and if there are a proper number of rails, maximum acoustic energy will be transferred from element 1 to element 6.

Operation of the device depends upon the proper choice of the spacing $d_3$ of the metal rails 20. For example, if rails 20 were replaced by a continuous mechanical contact between surfaces 3 and 5 over a distance of many acoustical wave lengths, the transfer of the acoustic wave 7 of the propagation element 1 to wave 8 of propagation element 6 could take place only if the two elements 1 and 6 had identical surface acoustic wave velocities. This is evidently an unreasonable constraint upon the designer's choices.

Figure 4:
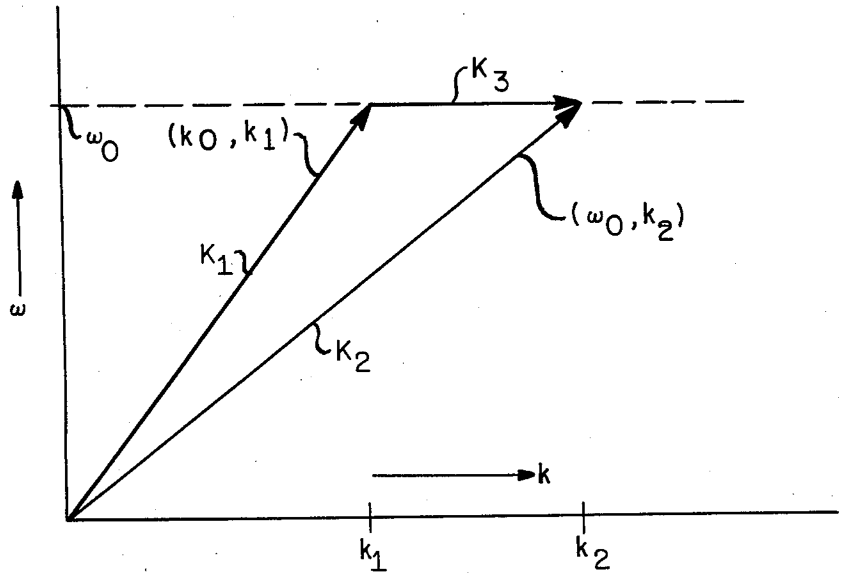
FIGS. 4 and 5 are wave vector diagrams useful in describing the operation of the invention.
Figure 5:
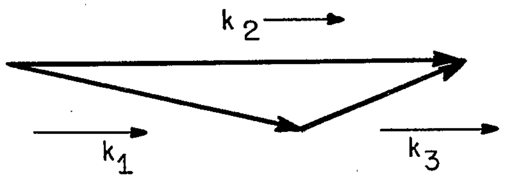

Synchronous coupling between the propagation elements 1, 6 is achieved according to the wave vector diagram of FIG. 4 wherein a carrier frequency ($\omega$) is plotted versus k, which is defined as the vector value of $2\pi/\lambda=(\omega/v)$. The surface acoustic wave in the high piezoelectric surface 3 is represented by the point $\omega_o$, $k_1$ and at the surface 5 of the propagation element 6 by $\omega_o$, $k_2$. The vector difference between these two waves is represented by vector $k_3$. The center-to-center spacing $d_3$ of the rails 20 is:

$$d_3=2\pi/k_3 \quad (1)$$

The vector $k_3$ is given by:

$$|k_3| = |k_2 - k_1| \quad (2)$$

$$= \omega_o\left(\frac{1}{v_2} - \frac{1}{v_1}\right) \quad (3)$$

where $v_1$ and $v_2$ are the velocities at surfaces 3 and 5, respectively. If the condition of Equation (1) is met, the injected surface wave 7 will be desirably synchronously coupled to the surface wave 8 at surface 5.

Figure 3:
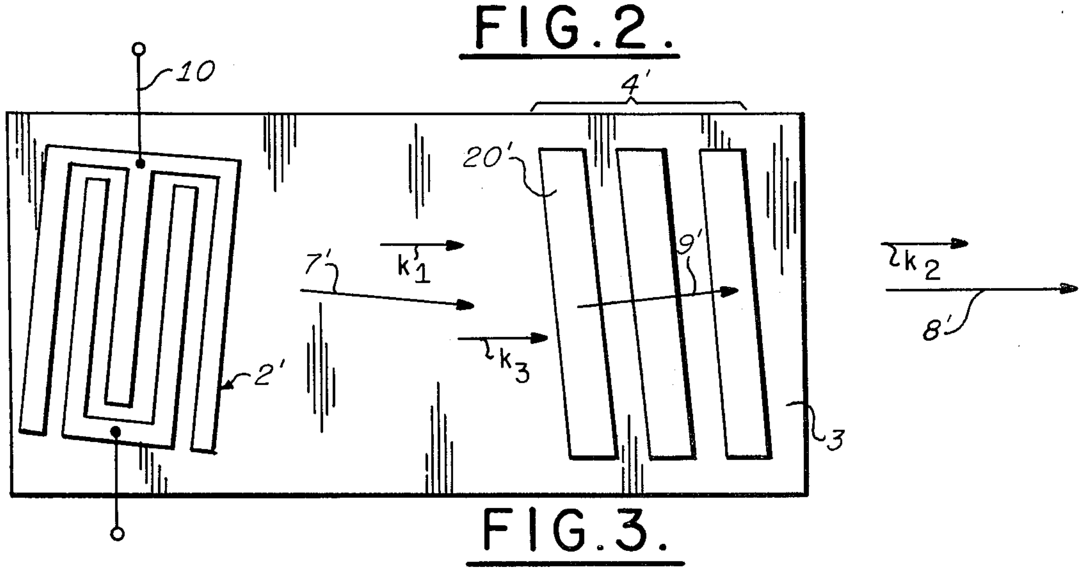
FIG. 3 is a view corresponding to FIG. 2 of a variation thereof.

A variation of the structure of FIGS. 1 and 2 is shown in FIG. 3, wherein the rail coupler 4' is slanted at an acute angle with respect to coupler 4 of FIG. 2, rails 20' still being maintained substantially parallel. The transducer 2' may be oppositely slanted by an acute angle. In any event, reflections from the rail array 20' are reflected out of the acoustic path so as not to distort the desired signal being transmitted through the coupler. In this instance, the k vectors will not be collinear, but will satisfy the condition $$\vec{K}_3=\vec{k}_2-\vec{k}_1 \quad (4)$$

Accordingly it is seen that the invention provides surface acoustic wave devices for efficiently coupling acoustic signals between strongly piezoelectric and substantially non-piezoelectric surfaces over an extended range of carrier frequencies and overcoming the difficulties of the prior art. The coupler makes optimum use of a material of high piezoelectric coupling coefficient for actual wave coupling purposes. On the other hand, optimum propagation, for example for delay purposes, is the function of a selected inexpensive temperature-insensitive material having a substantially or relative low piezoelectric coupling coefficient.

While the invention has been described in its preferred embodiments, it is to be understood that the words which have been used are words of description rather than of limitation and that changes may be made within the purview of the appended claims without departing from the true scope and spirit of the invention in its broader aspects.

What is claimed is:

1. A surface acoustic wave signal coupling apparatus comprising:
   - a first energy propagating element having a strongly piezoelectric surface for propagating thereat surface acoustic waves in a predetermined propagation direction;
   - transducer means affixed to said piezoelectric surface in energy exchanging relation with said surface acoustic waves;
   - a second energy propagating element having a surface substantially less piezoelectric than said strongly piezoelectric surface for propagating thereat surface acoustic waves substantially parallel to said propagation direction, said second element surface being disposed immediately adjacent to and opposite from said first element surface; and
   - a plurality of equispaced rails aligned substantially perpendicular to said propagation direction disposed between said first element surface and said second element surface for exchanging surface acoustic energy therebetween.

2. Apparatus as described in claim 3 wherein said plurality of equispaced rails is aligned at an acute angle with respect to said propagation direction.

3. Apparatus as described in claim 1 wherein said transducer means comprises electrically excitable interdigital end fire array means in energy exchanging relation with said surface acoustic waves.

4. Apparatus as described in claim 3 wherein each of said rails is rectangular in cross-section.

5. Apparatus as described in claim 3 wherein said first energy propagating element is fabricated of $LiNbO_3$.

6. Apparatus as described in claim 3 wherein said second energy propagating element is quartz.

7. Apparatus as described in claim 3 wherein said second energy propagating element is a semiconductor.

* * * * *